(12) United States Patent
Cha et al.

(10) Patent No.: US 9,412,959 B1
(45) Date of Patent: Aug. 9, 2016

(54) METHOD OF MAKING A SOLAR CELL

(71) Applicant: INSTITUTE OF NUCLEAR ENERGY RESEARCH ATOMIC ENERGY COUNCIL, EXECUTIVE YUAN, Taoyuan (TW)

(72) Inventors: Hou-Chin Cha, Taoyuan (TW); Yu-Ching Huang, Taoyuan (TW); Chih-Min Chuang, Taoyuan (TW); De-Han Lu, Taoyuan (TW); Zheng-Lin Yu, Taoyuan (TW); Chia-Te Yen, Taoyuan (TW); Yeong-Der Lin, Taoyuan (TW); Charn-Ying Chen, Taoyuan (TW); Cheng-Si Tsao, Taoyuan (TW)

(73) Assignee: INSTITUTE OF NUCLEAR ENERGY RESEARCH ATOMIC ENERGY COUNCIL, EXECUTIVE YUAN, Taoyuan (TW)

( * ) Notice: Subject to any disclaimer, the term of this patent is extended or adjusted under 35 U.S.C. 154(b) by 0 days.

(21) Appl. No.: 14/984,851

(22) Filed: Dec. 30, 2015

(30) Foreign Application Priority Data

Oct. 16, 2015 (TW) .............................. 104133955 A

(51) Int. Cl.
*H01L 51/00* (2006.01)
*H01L 51/42* (2006.01)
*H01L 51/44* (2006.01)

(52) U.S. Cl.
CPC .......... *H01L 51/424* (2013.01); *H01L 51/0007* (2013.01); *H01L 51/0097* (2013.01); *H01L 51/442* (2013.01); *H01L 51/005* (2013.01); *H01L 51/0036* (2013.01); *H01L 51/0047* (2013.01); *H01L 51/0052* (2013.01)

(58) Field of Classification Search
None
See application file for complete search history.

(56) References Cited

U.S. PATENT DOCUMENTS

| | | | | |
|---|---|---|---|---|
| 2006/0228466 A1* | 10/2006 | Yu | .................. | H01L 51/0005 427/64 |
| 2013/0062581 A1* | 3/2013 | May | .................. | C09D 5/24 252/519.3 |
| 2015/0115204 A1* | 4/2015 | Sekine | .................. | C07C 25/24 252/500 |
| 2015/0249214 A1* | 9/2015 | Watanabe | .............. | H01L 51/42 136/263 |
| 2015/0303383 A1* | 10/2015 | Takimiya | ............ | H01L 51/0074 438/99 |
| 2016/0049592 A1* | 2/2016 | Yonekuta | .............. | C07F 7/0812 252/500 |

* cited by examiner

*Primary Examiner* — Alexander Ghyka
(74) *Attorney, Agent, or Firm* — Muncy, Geissler, Olds & Lowe, P.C.

(57) ABSTRACT

A method of making a solar cell includes: preparing an active layer solution including p-type and n-type organic semiconductor materials, a solvent, and an additive, the additive containing 1, 8-iodooctane (DIO) and 1-chloronaphthalene (CN) that has a total volume not greater than 3 vol % based on a total volume of the solvent and the additive; preparing an assembly having a substrate, a first electrode layer, and a first transporting layer; coating the active layer solution on the first transporting layer to form a wet active layer; drying the wet active layer at a temperature not greater than 60° C.; and forming a second transporting layer and a second electrode layer on the active layer.

11 Claims, 2 Drawing Sheets

US 9,412,959 B1

METHOD OF MAKING A SOLAR CELL

CROSS-REFERENCE TO RELATED APPLICATION

This application claims priority of Taiwanese Application No. 104133955, filed on Oct. 16, 2015.

FIELD

The disclosure relates to a method of making a solar cell, more particularly to a method of making a solar cell using a batch process.

BACKGROUND

A general method of forming an active layer of a solar cell using a wet process mainly includes: dissolving an active layer material, e.g., PTB7:$PC_{71}BM$, in a solvent to form an active layer solution; and coating the active layer solution on a substrate to form an active layer using a spin coating technique, a sheet-to-sheet process, or a roll-to-roll process. To improve photovoltaic conversion efficiency of the solar cell made from conductive polymers with low band gap, an additive having a relatively high boiling point (e.g., 1,8-iodooctane (DIO) or 1-chloronaphthalene (CN)) is added into the active layer solution. Thus, the active layer formed has a superior internal nanostructure that facilitates carrier transmission, separation of the conductive polymers and fullerenes, and crystallization of the conductive polymers.

The active layer solution coated on the substrate using the spin coating technique is dried at a relatively fast speed under the room temperature. For a batch process, such as the sheet-to-sheet process or the roll-to roll process, the active layer solution that is coated on the substrate needs to be dried to form the active layer. However, an undesirable flow of the active layer solution is likely to occur on the substrate before the active layer solution is dried, and may result in a non-uniform distribution of the additive in the active layer, which may increase deviation of the power conversion efficiency (PCE) of the solar cell.

In order to overcome the aforesaid problem, the active layer may be heated to expedite drying so as to prevent the undesirable flow. However, the heating process may adversely affect batch-to-batch consistency of the power conversion efficiency of the solar cell.

SUMMARY

Therefore, an object of the disclosure is to provide a method of making a solar cell that can alleviate at least one of the drawbacks of the prior arts.

According to the disclosure, the method includes: preparing an active layer solution, the active layer solution including a p-type organic semiconductor material, an n-type organic semiconductor material, a solvent, and an additive that includes 1, 8-iodooctane (DIO) and 1-chloronaphthalene (CN), a total volume of DIO and CN being not greater than 3 vol % based on a total volume of the solvent and the additive; preparing an assembly including a substrate, a first electrode layer formed on the substrate, and a first transporting layer formed on the first electrode layer; coating the active layer solution on the first transporting layer to form a wet active layer; drying the wet active layer at a temperature not greater than 60° C.; and sequentially forming a second transporting layer and a second electrode layer on the active layer, the first transporting layer being one of an electron transporting layer and a hole transporting layer, the second transporting layer being the other one of the electron transporting layer and the hole transporting layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
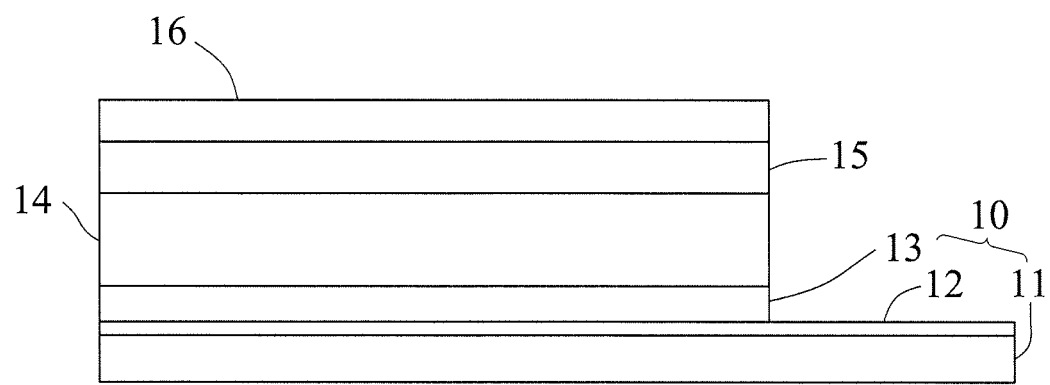
FIG. 1 is a schematic view illustrating a solar cell made by an embodiment of a method of making the solar cell according to the disclosure.

Referring to FIG. 1, a solar cell that is formed using an embodiment of a method of making a solar cell according to this disclosure includes a substrate 11, a first electrode layer 12, a first transporting layer 13, an active layer 14, a second transporting layer 15, and a second electrode layer 16 that are sequentially formed on the substrate 11.

The substrate 11 may be inflexible or flexible, and may be made from glass or a polymer material. When the substrate 11 is flexible, it is suitable for a roll-to-roll process.

The first transporting layer 13 is one of an electron transporting layer and a hole transporting layer, and the second transporting layer 15 is the other one of the electron transporting layer and the hole transporting layer. In this embodiment, the first transporting layer 13 is the electron transporting layer and the second transporting layer 15 is the hole transporting layer.

The first electrode layer 12 serves as a cathode, and is made from transparent and conductive metal oxide (e.g., indium tin oxide (ITO)). The first transporting layer 13 may be made from zinc oxide (ZnO), titanium oxide ($TiO_2$), poly(ethylenimine)-ethoxylated (PEIE), poly[(9,9-bis(3'-(N,N-dimethylamino)propyl)-2,7-fluorene)-alt-2,7-(9,9-dioctylfluorene)] (PFN), etc. The active layer 14 includes a p-type organic semiconductor material and an n-type organic semiconductor material. The p-type organic semiconductor material may be a conductive polymer, such as poly(3-hexylthiophene) (P3HT), poly[[4,8-bis[(2-ethylhexyl)oxy]benzo[1,2-b:4,5-b']dithiophene-2,6-diyl][3-fluoro-2-[(2-ethylhexyl) carbonyl]thieno[3,4-b]thiophenediyl]] (PTB7), poly[2,6-(4,4-bis-(2-ethylhexyl)-4H-cyclopenta[2,1-b;3,4-b']dithiophene)-alt-4,7(2,1,3-benzothiadiazole)] (PCPDTBT), etc. The n-type organic semiconductor material may be a fullerene derivative, such as Indene-$C_{70}$ Bisadduct (ICBA), [6,6]-phenyl-$C_{71}$-butyric acid methyl ester ($PC_{71}BM$), [6,6]-phenyl-$C_{61}$-butyric acid methyl ester ($PC_{61}BM$), etc. The second transporting layer 15 may be made from $MoO_3$, poly(2,3-dihydrothieno-1,4-dioxin)-poly(styrene sulfonate) (PEDOT:PSS), etc. The second electrode layer 16 serves as an anode, and may be made from metal with a relatively high work function (e.g., Au, Ag). Since the structures and the materials used for the first electrode layer 12, the second electrode layer 16, the first transporting layer 13, the active layer 14, and the second transporting layer 15 are well known to those skilled in the art, further details thereof are not provided herein.

In this embodiment, the active layer 14 further includes an additive that includes 1, 8-iodooctane (DIO) and 1-chloronaphthalene (CN) at a volume ratio of, e.g., 1:1.

Figure 2:
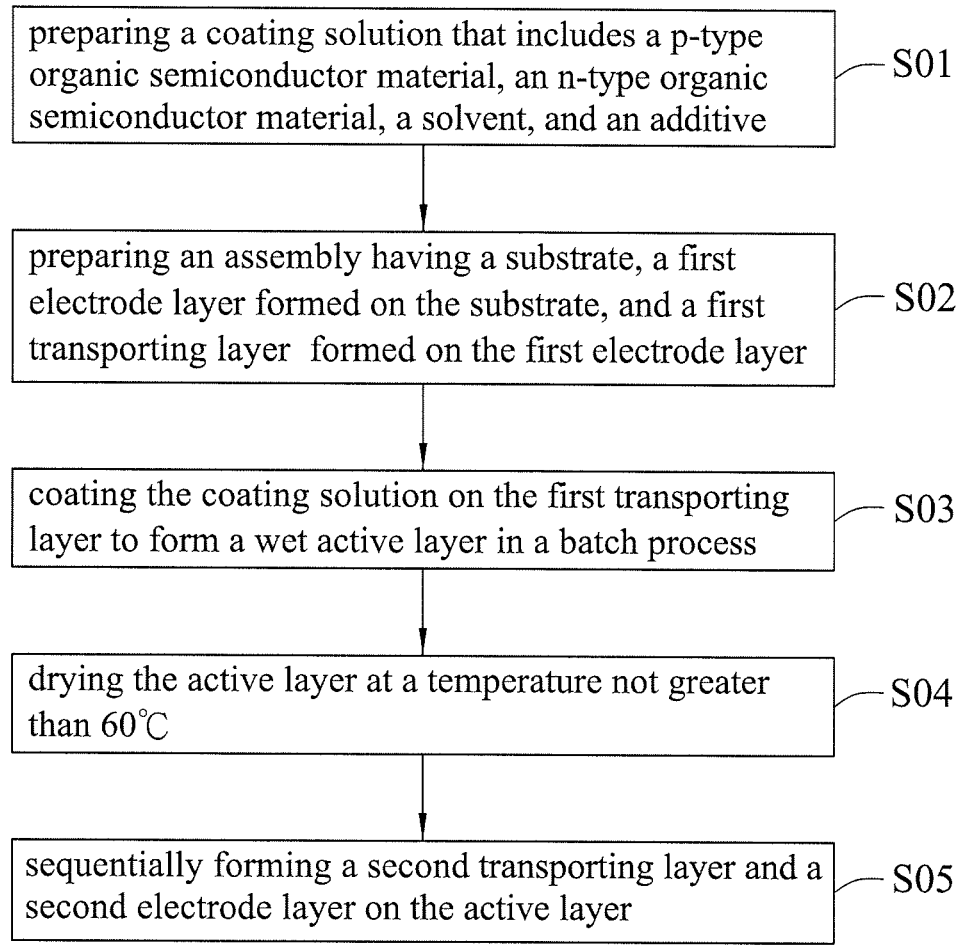
FIG. 2 is a flow chart of the embodiment of the disclosure.

Referring to FIGS. 1 and 2, the embodiment of the method of making the aforesaid solar cell includes steps of S01 to S05.

In step S01, an active layer solution is prepared. The active layer solution includes a p-type organic semiconductor material, an n-type organic semiconductor material, a solvent, and an additive. The p-type organic semiconductor material, the n-type organic semiconductor material, and the additive are as mentioned above. In this embodiment, a total volume of DIO and CN in the additive is not greater than 3 vol % based on a total volume of the solvent and the additive. The solvent may be xylene or chlorobenzene. In certain embodiment, xylene may be o-xylene, p-xylene, or m-xylene.

In one embodiment, the p-type organic semiconductor material is PTB7, the n-type organic semiconductor material is $PC_{71}BM$, and the solvent is o-xylene. The active layer solution is prepared by dissolving 7 mg of PTB7 and 10.5 mg of $PC_{71}BM$ in 1 ml of o-xylene, followed by adding the additives under stirring.

In step S02, an assembly 10 is prepared. The assembly 10 includes the substrate 11, the first electrode layer 12 formed on the substrate 11, and the first transporting layer 13 formed on the first electrode layer 12.

The first electrode layer 12 is formed on the substrate 11 by sputtering or vapor deposition. In one embodiment, the substrate 11 is flexible and is made from a polyester material. The first electrode layer 12 is formed on the substrate 11 by sputtering and is made from ITO. The first transporting layer 13 is then formed on the first electrode layer 12 and is made from aluminum-doped zinc oxide (AZO). Since the substrate 11 is flexible, the first transporting layer 13 may be formed using the roll-to-roll process.

In step S03, the active layer solution is coated on the first transporting layer 13 to form a wet active layer.

In step S04, the wet active layer is dried at a temperature not greater than 60° C. to form the active layer 14.

Step S03 may be conducted using a roll-to-roll process or a sheet-to-sheet batch process. In certain embodiments, Step S03 is conducted using a slot die coating technique or a blade coating technique. Device used and related operating parameters for the roll-to-roll process and the sheet-to-sheet batch process are well known to those skilled in the art and are not further discussed in this disclosure. The wet active layer is dried at a temperature not greater than 60° C. for a predetermined period of time. Furthermore, with the particular volume ratio of DIO to CN and the specific volume percent of the additive, the conventional flow problem encountered in the prior art can be avoided. Furthermore, the power conversion efficiency of the solar cell made by the embodiment is improved and is more consistent.

In this embodiment, the slot die coating technique is used to form the wet active layer and includes: disposing the assembly 10 on a stage of a slot coating apparatus; coating the active layer solution on the first transporting layer 13 of the assembly 10 at a coating speed of 2 m/minute so as to form the wet active layer on the assembly 10; drying the wet active layer for 2 minutes at the temperature not greater than 60° C. to form the active layer 14; and taking out the assembly 10 along with the active layer 14 from the stage.

It should be noted that the active layer 14 may be dried at room temperature. In certain embodiment, the active layer 14 is dried at room temperature for not greater than 2 minutes. In certain embodiments, the active layer is dried at a temperature not greater than 30° C.

In step S05, the second transporting layer 15 and the second electrode layer 16 are sequentially formed on the active layer 14 to form the solar cell.

The technique for forming the second electrode layer 16 and the second transporting layer 15 is well known in the art and are not further discussed in this disclosure. In one embodiment, the second transporting layer 15 is the hole transporting layer and is made from $MoO_3$, and the second electrode layer 16 is made from Ag.

When the substrate 10 is flexible, each of the above-mentioned layers may be formed using a roll-to-roll process to reduce the manufacturing cost of making the solar cell.

Table 1 shows properties and power conversion efficiency of solar cells of the examples and comparative examples. The solar cells of Examples 1 to 4 (E1-E4) are made using the embodiment of this disclosure, in which the volume ratio of DIO to CN was 1:1. The wet active layers 14 in Examples 1 to 4 were respectively dried at 30° C., 40° C., 50° C., and 60° C. for 2 minutes. The methods for making the solar cells of Comparative Examples 1 to 4 (CE1-CE4) were respectively similar to those of Examples 1 to 4 except that the active layer solution in Comparative Examples 1 to 4 did not contain the additive. The methods for making the solar cells of Comparative Examples 5 to 8 (CE5-CE8) were respectively similar to those of Examples 1 to 4 except that the additive were 6 vol % (3 vol % of DIO and 3 vol % CN) based on a total volume of the solvent and the additive. The methods for making the solar cells of Comparative Examples 9 to 12 (CE9-CE12) were respectively similar to those of Examples 1-4 except that the additive only includes 3 vol % DIO. The methods for making the solar cells of Comparative Examples 13 to 17 (CE13-CE17) were similar to those of Examples 1 to 4 except that the additive only includes 3 vol % CN, and the wet active layer in Comparative Examples 13 to 17 were respectively dried at 30° C., 40° C., 50° C., 60° C. and 70° C.

TABLE 1

|   | Additive (vol %) | Drying temp. (°C.) | Jsc* (mA/cm$^2$) | Voc** (V) | FF*** (%) | PCE (%) | PCE$_{MAX}$ (%) |
|---|---|---|---|---|---|---|---|
| E1 | DIO (1.5%) CN (1.5%) | 30 | 15.284 ± 0.058 | 0.738 ± 0.006 | 51.35 ± 1.443 | 5.795 ± 0.206 | 5.96 |
| E2 | DIO (1.5%) CN (1.5%) | 40 | 15.296 ± 0.385 | 0.74 ± 0.006 | 52.875 ± 0.727 | 5.982 ± 0.143 | 6.17 |
| E3 | DIO (1.5%) CN (1.5%) | 50 | 14.452 ± 0.334 | 0.746 ± 0.005 | 53.4 ± 0.648 | 5.759 ± 0.158 | 5.95 |
| E4 | DIO (1.5%) CN (1.5%) | 60 | 14.026 ± 0.194 | 0.738 ± 0.003 | 51.275 ± 0.714 | 5.307 ± 0.062 | 5.38 |
| CE1 | 0 | 30 | 5.063 ± 0.081 | 0.67 ± 0.067 | 31.1 ± 1.917 | 1.053 ± 0.102 | 1.19 |
| CE2 | 0 | 40 | 4.649 ± 0.09 | 0.721 ± 0.008 | 34.55 ± 0.823 | 1.158 ± 0.042 | 1.21 |
| CE3 | 0 | 50 | 4.045 ± 0.131 | 0.691 ± 0.019 | 37.1 ± 0.678 | 1.036 ± 0.03 | 1.07 |
| CE4 | 0 | 60 | 4.229 ± 0.092 | 0.678 ± 0.02 | 34.65 ± 1.741 | 0.996 ± 0.094 | 1.08 |
| CE5 | DIO (3%) CN (3%) | 30 | 11.275 ± 0.704 | 0.708 ± 0.008 | 54 ± 1.128 | 4.309 ± 0.258 | 4.57 |
| CE6 | DIO (3%) CN (3%) | 40 | 11.589 ± 0.151 | 0.733 ± 0.007 | 57.925 ± 1.024 | 4.917 ± 0.089 | 5.02 |

TABLE 1-continued

| | Additive (vol %) | Drying temp. (° C.) | Jsc* (mA/cm²) | Voc** (V) | FF*** (%) | PCE (%) | PCE$_{MAX}$ (%) |
|---|---|---|---|---|---|---|---|
| CE7 | DIO (3%) CN (3%) | 50 | 12.01 ± 0.082 | 0.725 ± 0.003 | 60.325 ± 0.486 | 5.254 ± 0.04 | 5.30 |
| CE8 | DIO (3%) CN (3%) | 60 | 12.657 ± 0.115 | 0.738 ± 0.009 | 62.4 ± 0.476 | 5.829 ± 0.107 | 5.95 |
| CE9 | DIO (3%) | 30 | 7.992 ± 0.288 | 0.626 ± 0.009 | 38.2 ± 0.424 | 1.909 ± 0.065 | 1.97 |
| CE10 | DIO (3%) | 40 | 10.383 ± 0.358 | 0.641 ± 0.027 | 40.75 ± 0.289 | 2.714 ± 0.179 | 2.87 |
| CE11 | DIO (3%) | 50 | 13.47 ± 0.133 | 0.66 ± 0.008 | 43.1 ± 0.56 | 3.831 ± 0.103 | 3.94 |
| CE12 | DIO (3%) | 60 | 15.597 ± 0.289 | 0.72 ± 0.005 | 54.825 ± 0.55 | 6.158 ± 0.189 | 6.35 |
| CE13 | DIO (3%) | 30 | 8.125 ± 0.267 | 0.653 ± 0.013 | 35.7 ± 1.84 | 1.898 ± 0.167 | 2.06 |
| CE14 | CN (3%) | 40 | 12.3 ± 0.445 | 0.724 ± 0.01 | 41.325 ± 1.656 | 3.678 ± 0.197 | 3.94 |
| CE15 | CN (3%) | 50 | 12.601 ± 0.186 | 0.761 ± 0.008 | 48.6 ± 0.849 | 4.662 ± 0.138 | 4.80 |
| CE16 | CN (3%) | 60 | 13.057 ± 0.45 | 0.775 ± 0.007 | 51.033 ± 2.38 | 5.159 ± 0.217 | 5.35 |
| CE17 | CN (3%) | 70 | 12.424 ± 0.194 | 0.771 ± 0.007 | 52.625 ± 0.45 | 5.038 ± 0.124 | 5.20 |

*Short-circuit current density
**Open-circuit voltage
***Fill Factor

Table 1 shows that although the wet active layers in examples 1 to 4 were dried at different temperatures, the power conversion efficiencies (PCE) of the solar cells in Examples 1 to 4 are not apparently changed. The result indicates that the PCE of the solar cell made using the embodiment according to this disclosure is not affected by the drying temperature of the wet active layer. However, the PCE of the solar cells in Comparative Examples 5 to 17, especially in Comparative Examples 9 to 17, are greatly changed dependent on the drying temperature. Besides, the PCE of the solar cells in Comparative Examples 1 to 4 are worse than those of the Examples 1 to 4. The result shows that the ratio of DIO to CN and the volume percentages of DIO and CN in the additive are important factors for the method of this embodiment. Furthermore, the solar cell made using the embodiment according to this disclosure can be manufactured under the condition that the wet active layer is dried at a relatively low temperature (30° C.), thereby saving cost for drying the wet active layer.

To summary up, with the particular ratio of DIO to CN and the specific volume percentage of DIO and CN in the additive, the PCE of the solar cell made by the embodiment of this disclosure is not affected by the drying temperature. Moreover, the active layer 14 may be dried at room temperature without heating.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment. Various features, aspects, and exemplary embodiment have been described herein. The features, aspects, and exemplary embodiment are susceptible to combination with one another as well as to variation and modification, as will be understood by those having skill in the art.

This disclosure is not limited to the disclosed exemplary embodiment but is intended to cover various arrangements included within the spirit and scope of the broadest interpretation so as to encompass all such modifications and equivalent arrangements.

What is claimed is:

1. A method of making a solar cell, comprising:
preparing an active layer solution, the active layer solution including a p-type organic semiconductor material, an n-type organic semiconductor material, a solvent, and an additive that includes 1,8-iodooctane (DIO) and 1-chloronaphthalene (CN), a total volume of DIO and CN being not greater than 3 vol % based on a total volume of the solvent and the additive;
preparing an assembly having a substrate, a first electrode layer formed on the substrate, and a first transporting layer formed on the first electrode layer;
coating the active layer solution on the first transporting layer to form a wet active layer;
drying the wet active layer at a temperature not greater than 60° C.; and
sequentially forming a second transporting layer and a second electrode layer on the active layer, the first transporting layer being one of an electron transporting layer and a hole transporting layer, the second transporting layer being the other one of the electron transporting layer and the hole transporting layer.

2. The method of claim 1, wherein a volume ratio of DIO to CN is 1:1.

3. The method of claim 1, wherein the wet active layer is dried at room temperature for not greater than 2 minutes.

4. The method of claim 1, wherein the solvent is xylene or chlorobenzene.

5. The method of claim 4, wherein xylene is o-xylene, p-xylene or m-xylene.

6. The method of claim 1, wherein the p-type organic semiconductor material includes a conductive polymer, and the n-type organic semiconductor material includes a Fullerene derivative.

7. The method of claim 1, wherein the substrate is flexible.

8. The method of claim 1, wherein the first transporting layer is the electron transporting layer, the second transporting layer being the hole transporting layer, the first electrode layer being a cathode, and the second electrode layer being an anode.

9. The method of claim 1, wherein the first transporting layer is the hole transporting layer, the second transporting layer being the electron transporting layer, the first electrode layer being an anode, and the second electrode layer being a cathode.

10. The method of claim 1, wherein coating the active layer solution on the first transporting layer is conducted using a roll-to roll process.

11. The method of claim 1, wherein coating the active layer solution on the first transporting layer is conducted using a sheet-to-sheet process.

* * * * *